United States Patent
Kazakevich et al.

(10) Patent No.: US 7,400,864 B2
(45) Date of Patent: Jul. 15, 2008

(54) METHOD AND APPARATUS FOR COMPENSATING FOR PHASE VARIATIONS CAUSED BY ACTIVATION OF AN AMPLIFIER

(75) Inventors: Leonid Kazakevich, Plainview, NY (US); Tanbir Haque, Long Island City, NY (US); Alpaslan Demir, Commack, NY (US); Robert Troiano, Farmingdale, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 722 days.

(21) Appl. No.: 10/863,977

(22) Filed: Jun. 9, 2004

(65) Prior Publication Data

US 2005/0233713 A1 Oct. 20, 2005

Related U.S. Application Data

(60) Provisional application No. 60/562,664, filed on Apr. 15, 2004.

(51) Int. Cl.
*H04B 1/04* (2006.01)
*H04K 1/02* (2006.01)

(52) U.S. Cl. .......... 455/114.2; 455/114.3; 455/126; 455/127.2; 375/296; 375/297

(58) Field of Classification Search .......... 455/114.2, 455/114.3, 126, 127.2; 375/296, 297
See application file for complete search history.

(56) References Cited

U.S. PATENT DOCUMENTS

| | | | | |
|---|---|---|---|---|
| 5,381,108 | A * | 1/1995 | Whitmarsh et al. | 330/2 |
| 5,469,115 | A * | 11/1995 | Peterzell et al. | 330/129 |
| 5,623,226 | A * | 4/1997 | Whitmarsh et al. | 330/2 |
| 5,740,520 | A * | 4/1998 | Cyze et al. | 455/69 |
| 6,373,902 | B1 * | 4/2002 | Park et al. | 375/296 |
| 6,587,513 | B1 * | 7/2003 | Ichihara | 375/296 |
| 6,721,370 | B1 * | 4/2004 | Kurihara | 375/297 |
| 6,873,833 | B2 * | 3/2005 | Yang et al. | 455/232.1 |
| 7,058,139 | B2 * | 6/2006 | Duperray | 375/297 |
| 2003/0223480 | A1 * | 12/2003 | Cafarella | 375/219 |
| 2004/0106380 | A1 * | 6/2004 | Vassiliou et al. | 455/73 |
| 2005/0018787 | A1 * | 1/2005 | Saed | 375/296 |
| 2005/0215206 | A1 * | 9/2005 | Granstrom et al. | 455/102 |
| 2006/0001408 | A1 * | 1/2006 | Southwell et al. | 323/282 |
| 2006/0183451 | A1 * | 8/2006 | Demir et al. | 455/232.1 |

* cited by examiner

*Primary Examiner*—Duc M Nguyen
(74) *Attorney, Agent, or Firm*—Volpe and Koenig, P.C.

(57) ABSTRACT

A method and apparatus that reduces the amount of constellation rotation due to power amplifier (PA) insertion phase variation during activation (i.e., turn on) of a transmitter. This is accomplished by applying an instantaneous phase rotation during the transmitter turn on at digital baseband to counteract and minimize unwanted phase variations.

6 Claims, 3 Drawing Sheets

METHOD AND APPARATUS FOR COMPENSATING FOR PHASE VARIATIONS CAUSED BY ACTIVATION OF AN AMPLIFIER

CROSS REFERENCE TO RELATED APPLICATION

This application claims priority from U.S. provisional application No. 60/562,664, filed Apr. 15, 2004, which is incorporated by reference as if fully set forth.

FIELD OF THE INVENTION

The present invention generally relates to wireless communication systems. More particularly, the present invention relates to digital signal processing (DSP) techniques used to compensate for phase variations due to activating a transmitter.

BACKGROUND

In a conventional time division duplex (TDD) system, a transmitter within the system is temporarily deactivated during receive time slots in order to reduce power consumption. However, once a turn on command is initiated, the bias current of a power amplifier (PA) in the transmitter requires a significant amount of time to move from its shut down value to its desired quiescent value. This type of time varying bias results in a proportional change in the PA insertion phase, which in turn will result in a rotation of the signal constellation.

An insertion phase variation will occur even if the input power of the transmitter is held constant. As a result, performance degradation of phase sensitive receiver algorithms at the beginning of time slots will occur unless the insertion phase variation is reduced and kept within some acceptable level when the transmitter is activated (i.e., turned on). A method and system for compensating for phase variations caused by activating the transmitter is desired.

SUMMARY

The present invention provides a method and a system that reduces the amount of constellation rotation due to insertion phase variation.

The insertion phase variation is adjusted when a transmitter or a power amplifier therein is turned on (i.e., activated). This is accomplished by incrementally applying an instantaneous phase rotation during transmitter turn on at digital baseband to counteract and minimize unwanted phase variations. The present invention is applicable to TDD, frequency division duplex (FDD), orthogonal frequency division multiplexing (OFDM), code division multiple access (CDMA) and time division synchronous CDMA (TDSCDMA) systems.

The transmitter includes at least one amplifier which causes the insertion phase deviation when transitioning from a deactivated state to an activated state, and means for establishing a period for the transmitter to transition to a quiescent state value associated with the activated state. The transmitter further includes a means for setting a target insertion phase that corresponds to the quiescent state value, and means for incrementally adjusting the insertion phase of the transmitter until the quiescent state value is equal to the target insertion phase when the amplifier is activated.

The means for incrementally adjusting the insertion phase of the transmitter includes an accumulator and a function unit (e.g., a look up table (LUT)) in communication with the accumulator. The function unit outputs at least one insertion phase rotation control function in response to power gain command values accumulated by the accumulator.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

The present invention provides a method and system that performs phase insertion adjustments in a transmitter when it transitions from a deactivated state to an activated state.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), frequency division duplex (FDD), code division multiple access (CDMA), CDMA 2000, time division synchronous CDMA (TD-SCDMA), orthogonal frequency division multiplexing (OFDM) or the like.

Figure 1:
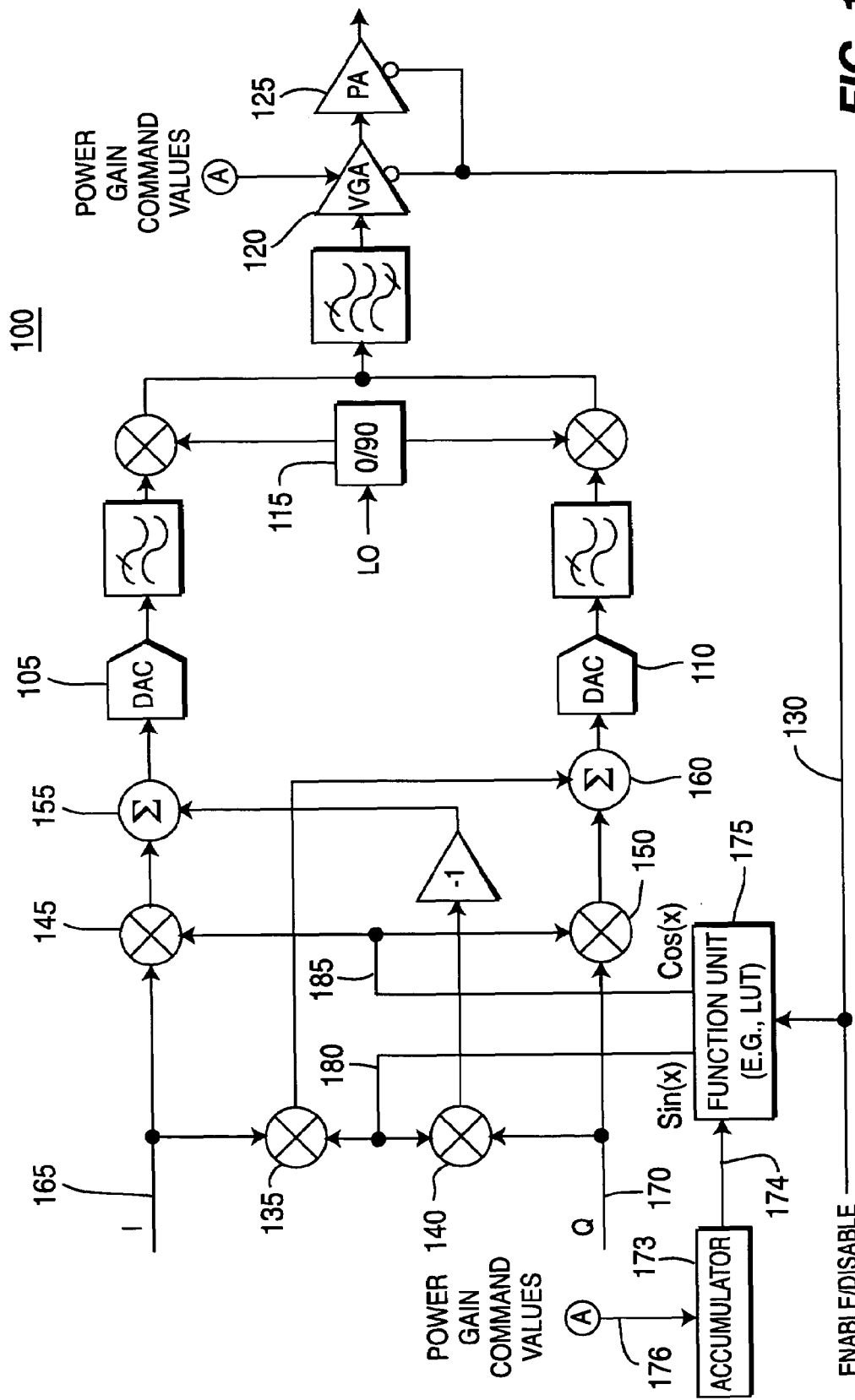
FIG. 1 is a block diagram of a radio transmitter operating in accordance with the present invention.

FIG. 1 is a block diagram of a transmitter 100 operating in accordance with the present invention. The transmitter includes a pair of digital to analog converters (DACs) 105, 110, a modulator 115, a radio frequency (RF) variable gain amplifier (VGA) 120 and a PA (power amplifier) 125. The RF VGA 120 and PA 125 are selectively enabled and disabled by control line 130. Furthermore, the transmitter 100 includes multipliers 135, 140, 145, 150 and adders 155 and 160. The transmitter 100 generates signals based on a real (Re) I signal component 165 and an imaginary (jIm) Q signal component 170. The phase of the signal components Re and jIm by x degrees ($e^{jx}$) are rotated as described by Equation 1 below:

$$(Re+jIm) \times e^{jx} = (Re+jIm) \times (\cos(x) + j \sin(x)) \qquad \text{Equation 1}$$

The transmitter 100 deactivates the RF VGA 120, the PA 125 and other power consuming components of the transmitter 100 during the occurrence of receive time slots in a TDD type system, thus essentially deactivating the transmitter 100. Based on the condition of control line 130, and the output 174 of an accumulator 173, a function unit (e.g., an LUT) 175 is used to provide a phase offset (x) to compensate for phase variations caused by deactivating or activating the transmitter 100. Alternatively, other devices and/or techniques may be used in lieu of the accumulator 173.

Figure 2:
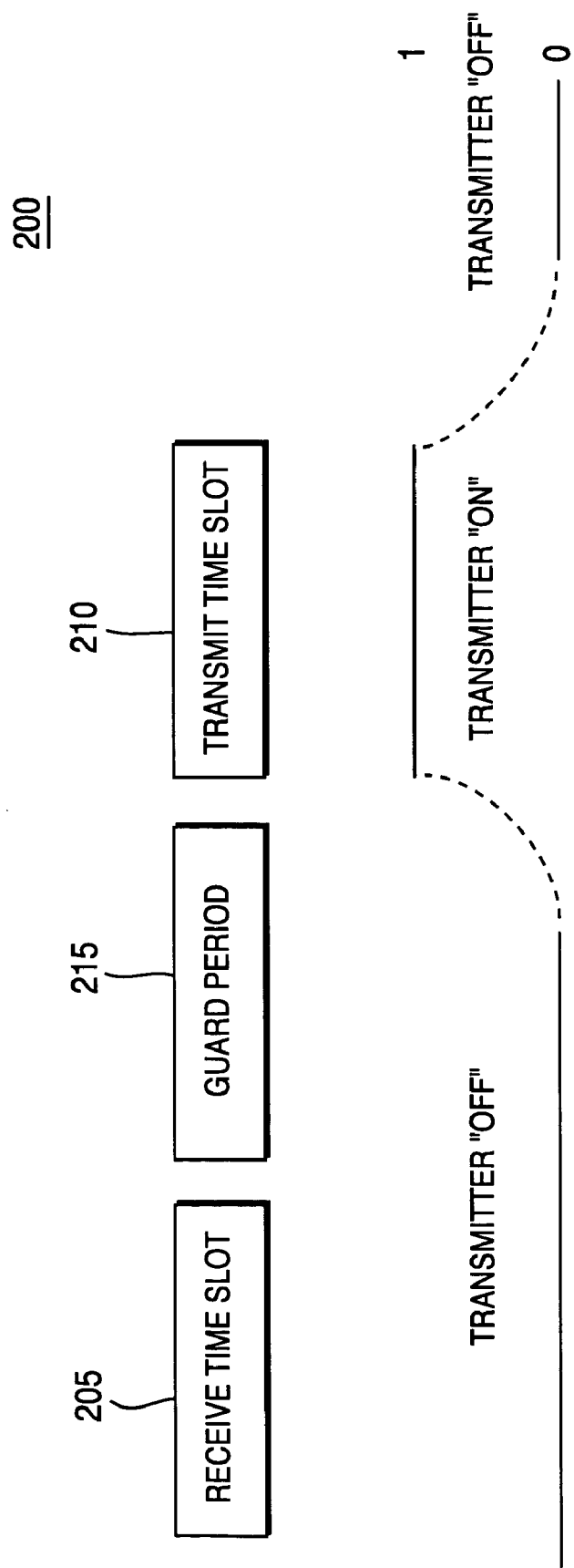
FIG. 2 is a timing diagram showing time slots separated by a guard period during which the transmitter of FIG. 1 may be activated.

FIG. 2 is a timing diagram 200 showing a receive time slot 205 and a transmit time slot 210 separated by a guard period 215 during which transmitter (i.e., amplifier) switching 220 occurs.

Figure 3:
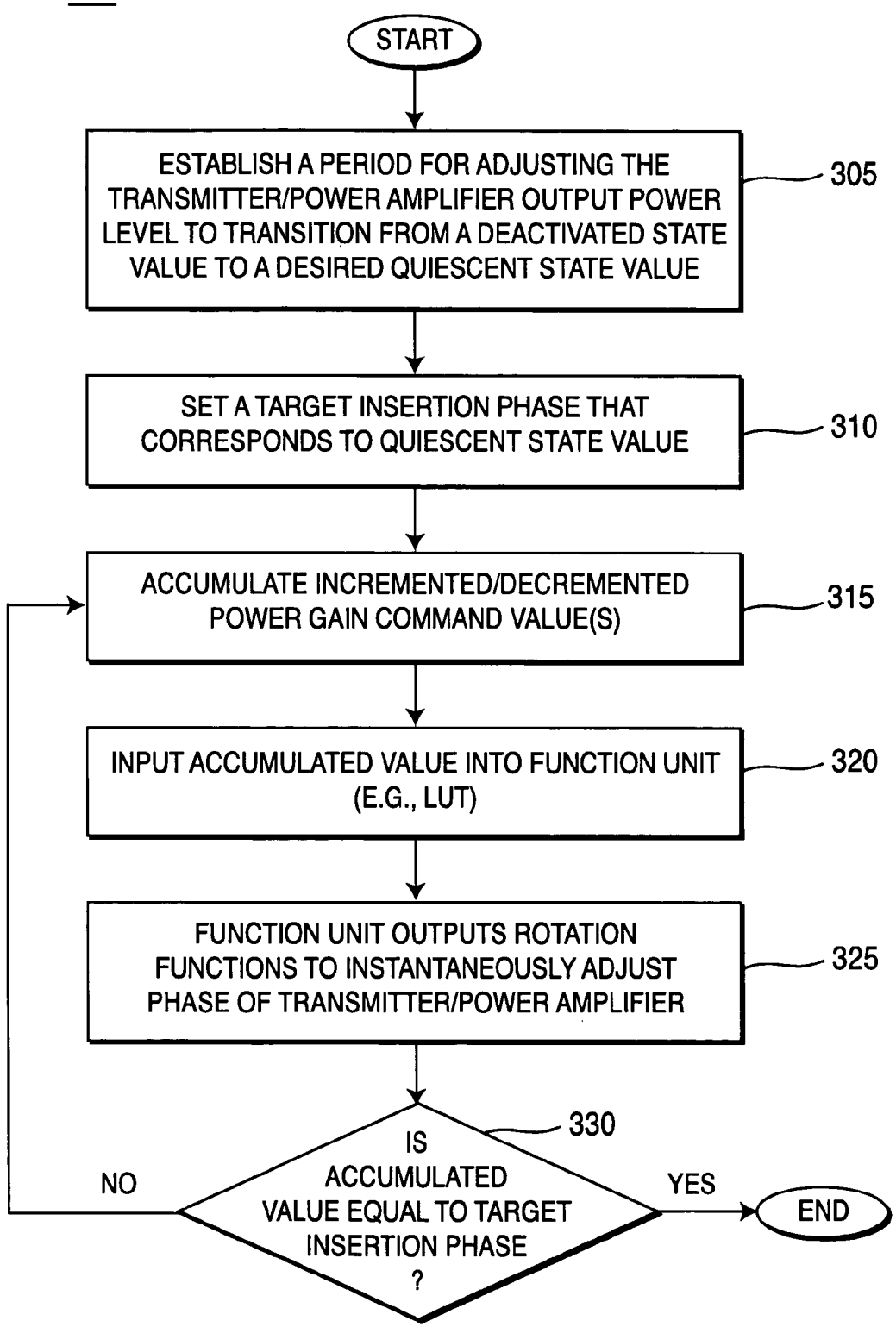
FIG. 3 is a flow chart of a process including steps implemented to continuously counteract the effects of phase offsets introduced into the transmitter of FIG. 1 due to the powering up of an amplifier therein.

FIG. 3 is a flow chart of a process 300 including steps implemented to continuously counteract the effects of phase offsets introduced into the transmitter 100 due to the powering up of at least one amplifier therein. In step 305, a period is established for adjusting the output power level of the transmitter 100, and at least one power amplifier therein, for the transmitter 100 to transition from a deactivated state ("OFF") value to a desired quiescent ("ON") state value when the transmitter 100 is activated. The insertion phase of the transmitter 100 will overshoot the "ON" value and eventually settle. In step 310, a reference target insertion phase is set that corresponds to the quiescent state value of the transmitter 100. The function unit 175 detects a change on the control line 130 and instantaneously adjusts the insertion phase of the transmitter 100 by inputting incremented and/or decremented power gain control values into the accumulator 173 via an accumulator input 176. The same power gain control values are provided to the RF VGA 120. The transmitter 100, and thus the amplifiers 120, 125, therein, are activated (i.e., turned on) during the guard period 215. Because it takes a substantial amount of time for an applied AGC incremented value to settle in the transmit chain, the transmitter 100 is required to provide sufficient time periods for implementing ramp up and ramp down of the transmitter 100.

In step 315, an incremented power gain command value provided on input 176 is input into accumulator 173. In step 320, the accumulator 173 outputs an accumulated value 174 to the function unit 175. In step 325, the function unit 175 outputs one or more rotation functions of "x", (e.g., sin (x), cos (x)), to instantaneously adjust the phase of the transmitter 100. In step 330, a determination is made as to whether the accumulated value output 174 is equal to the target insertion phase. If, in step 330, the accumulated value output 174 is determined not to be equal to the target insertion phase, the process 300 repeats steps 315, 320, 325 and 330 until the accumulated value 174 is determined to be equal to the target insertion phase.

In a preferred embodiment of the present invention, the function unit 175 at digital baseband instantaneously adjusts the insertion phase of the transmitter 100 by providing a value of "x" such that it is sufficiently close to the desired quiescent value at the time of transmitter switching. The value of "x" is then gradually reduced to zero such that the overall insertion phase deviation is maintained from the quiescent value to within some acceptable amount. In order to provide both continuous and discrete phase adjustments, the accumulator 173 may be used to indicate to the function unit 175 what the current power is by summing up several incremented and/or decremented power gain control values 176.

While this invention has been particularly shown and described with reference to preferred embodiments, it will be understood by those skilled in the art that various changes in form and details may be made therein without departing from the scope of the invention described hereinabove.

What is claimed is:

1. A transmitter comprising:
   a variable gain amplifier which causes insertion phase deviation when transitioning from a deactivated state to an activated state, wherein the variable gain amplifier is configured to receive power gain command values;
   an accumulator configured to receive and accumulate the power gain control values; and
   a look up table (LUT) configured to detect when the variable gain amplifier transitions from the deactivated state to the activated state, and output at least one insertion phase rotation control function in response to the power gain command values accumulated by the accumulator to counteract the effects of phase offsets introduced into the transmitter due to powering up the variable gain amplifier from the deactivated state to the activated state.

2. The transmitter of claim 1 wherein a period is established for the transmitter to transition to a quiescent state value associated with the activated state, a target insertion phase that corresponds to the quiescent state value is set, and the insertion phase of the transmitter is incrementally adjusted until the quiescent state value is equal to the target insertion phase when the variable gain amplifier is activated.

3. A wireless transmit/receive unit (WTRU) comprising:
   a variable gain amplifier which causes insertion phase deviation when transitioning from a deactivated state to an activated state, wherein the variable gain amplifier is configured to receive power gain command values;
   an accumulator configured to receive and accumulate the power gain control values; and
   a look up table (LUT) configured to detect when the variable gain amplifier transitions from the deactivated state to the activated state, and output at least one insertion phase rotation control function in response to the power gain command values accumulated by the accumulator to counteract the effects of phase offsets introduced into the WTRU due to powering up the variable gain amplifier from the deactivated state to the activated state.

4. The WTRU of claim 3 wherein a period is established for the WTRU to transition to a quiescent state value associated with the activated state, a target insertion phase that corresponds to the quiescent state value is set, and the insertion phase of the WTRU is incrementally adjusted until the quiescent state value is equal to the target insertion phase when the variable gain amplifier is activated.

5. An integrated circuit (IC) comprising:
   a variable gain amplifier which causes insertion phase deviation when transitioning from a deactivated state to an activated state, wherein the variable gain amplifier is configured to receive power gain command values;
   an accumulator configured to receive and accumulate the power gain control values; and
   a look up table (LUT) configured to detect when the variable gain amplifier transitions from the deactivated state to the activated state, and output at least one insertion phase rotation control function in response to the power gain command values accumulated by the accumulator to counteract the effects of phase offsets introduced into the IC due to powering up the variable gain amplifier from the deactivated state to the activated state.

6. The IC of claim 5 wherein a period is established for the IC to transition to a quiescent state value associated with the activated state, a target insertion phase that corresponds to the quiescent state value is set, and the insertion phase of the IC is incrementally adjusted until the quiescent state value is equal to the target insertion phase when the variable gain amplifier is activated.

* * * * *